United States Patent
Lindberg et al.

(10) Patent No.: US 6,438,719 B1
(45) Date of Patent: Aug. 20, 2002

(54) MEMORY SUPERVISION

(75) Inventors: Mikael Lindberg, Täby; Stefan Gustafsson; Mats Ernkell, both of Stockholm, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/378,457

(22) Filed: Aug. 20, 1999

(30) Foreign Application Priority Data

Aug. 21, 1998 (SE) .............................. 9802800

(51) Int. Cl.$^7$ .................. G01R 31/28; G06F 11/00; G11C 7/00; G11C 29/00
(52) U.S. Cl. .................. 714/720; 714/735; 365/200; 365/201
(58) Field of Search ................ 714/718, 719, 714/720, 735; 365/200, 201

(56) References Cited

U.S. PATENT DOCUMENTS

| | | | | |
|---|---|---|---|---|
| 4,414,665 A | * | 11/1983 | Kimura et al. .............. | 714/719 |
| 5,022,007 A | * | 6/1991 | Arimoto et al. ............. | 365/201 |
| 5,060,230 A | * | 10/1991 | Arimoto et al. ............. | 714/719 |
| 5,274,648 A | * | 12/1993 | Eikill et al. ................. | 714/719 |
| 5,384,784 A | * | 1/1995 | Mori et al. ................. | 714/718 |
| 5,436,911 A | * | 7/1995 | Mori ........................... | 714/719 |
| 5,436,912 A | | 7/1995 | Lustig | |
| 5,446,741 A | * | 8/1995 | Boldt et al. ................. | 714/718 |
| 5,479,413 A | * | 12/1995 | Sicola et al. ................ | 714/718 |
| 5,640,354 A | * | 6/1997 | Jang et al. ................... | 365/201 |
| 5,903,575 A | * | 5/1999 | Kikuda ........................ | 714/719 |
| 6,195,771 B1 | * | 2/2001 | Tanabe et al. .............. | 714/718 |
| 6,230,292 B1 | * | 5/2001 | Duesman et al. ........... | 714/718 |

FOREIGN PATENT DOCUMENTS

| | | |
|---|---|---|
| DE | 31 15 524 | 2/1982 |
| EP | 0 276 047 | 7/1988 |
| JP | 58056294 | 4/1983 |
| JP | 59112494 | 6/1984 |
| JP | 10134599 | 5/1998 |

* cited by examiner

*Primary Examiner*—Albert Decady
*Assistant Examiner*—Joseph D. Torres
(74) *Attorney, Agent, or Firm*—Burns, Doane, Swecker & Mathis, L.L.P.

(57) ABSTRACT

A method and system for testing a memory in operation. A storage unit is used to temporarily free one memory location in the memory, making it possible to check this memory location for bit errors. Data intended for the selected memory location is stored in the storage unit, and instead a test pattern is written into the memory location to be tested and read out again, all in coordination with the normal operation of the memory. If the pattern read from the test location does not match the written test pattern, an alarm is raised.

33 Claims, 13 Drawing Sheets

MEMORY SUPERVISION

BACKGROUND

The present invention generally relates to memory supervision, and more particularly to a method and system for testing a memory in operation.

Memory devices are found in numerous applications of all modern technologies. They are widely used in different fields of electronics and communication. In the specific field of telecommunication, memory devices play an important role in communication switches.

A communication switch generally comprises speech stores for storing user data, and control stores for storing control information that control the switching of the user data. It is of course important that the speech stores and control stores operate properly, and in operation, the speech stores and control stores should be supervised so that they can be promptly replaced in the case of a hardware failure.

According to a particular type of switching called circuit switching, the user data is normally assigned to time slots that are arranged in frames. In the communication switch, the user data is moved between different time slots and frames. This is done by storing the user data in speech stores and storing control information in control stores.

According to the prior art, a through connection test (TCT) is performed for each connection in order to ensure that data in an incoming time slot reaches an outgoing time slot. In a TCT, a parity error is inserted in the incoming time slot to be tested, and the connection path which may consist of speech stores, multiplexors and interfaces is supervised by checking that the parity error reaches the corresponding outgoing time slot.

Although the through connection test works satisfactory in many respects, the TCT-approach has a number of drawbacks:

A real parity error may erroneously fail the TCT;

The TCT only checks the path during the setup of a connection;

The software has to be coordinated to control both inputs and outputs;

The method requires a significant delay and is not scaleable; and

In a speech store or control store based on a RAM (Random Access Memory), there might be stuck-at faults which escape the usual parity checks; a situation which could result in a data transmission problem, the source of which is difficult to localize.

U.S. Pat. No. 5,436,912 relates to a circuit arrangement for testing a semiconductor memory by means of parallel tests using various test bit patterns, in which any n-tuples of test bits can be written into at least one n-bit long register. The n-tuple of test bits located in each register can be written via data lines of the semiconductor memory into a multiplicity of memory cell n-tuples having a common word-line. The n-tuple of test bits in each register can be supplied to a multiplicity of comparator circuits. The bit patterns of the memory cell n-tuples having a common word line can be read out via data lines and with which the n-tuples of test bits can be compared in the comparator circuits. The comparator outputs are combined by pairs of wired OR-lines to form an address matrix constructed so as to enable location of faulty individual memory cells or faulty memory cell n-tuples.

European Patent Application 0,276,047 relates to a semiconductor integrated circuit device in which a program for information processing is stored in a read only memory formed of an EPROM (electrically programmable read only memory). To improve the reliability of the integrated circuit device, the EPROM has a storage area formed by dummy storage elements distinct from the normal storage elements of the memory. Access to the dummy storage elements is permitted on the basis of a control signal from an external terminal. The dummy storage elements are used for a test of the write operation of the memory by writing data into those dummy elements such that the data and word lines and the selection circuit for those lines can be tested. By selecting the dummy word or data line, and having the other normal word or data lines deselected, the dummy elements can be tested, thereby permitting testing of the memory even though the other memory elements are not erasable.

SUMMARY

A general object of the invention is to find a way to test a memory, such as a RAM, while it is in operation.

It is an object of the invention is to provide a method and system for testing a memory in operation.

In particular, it is desirable to continuously check the function of a speech store or a control store in operation in a communication switch.

These and other objects are met by the invention as defined by the accompanying patent claims.

According to a general inventive concept, a storage unit is used to temporarily free one memory location in the memory, making it possible to check this memory location for bit errors. A test pattern is written into the memory location to be tested and read out again in coordination with the normal operation of the memory. If the pattern read from the test location does not match the written test pattern, an alarm is raised.

All memory locations in the memory can be tested to make sure that there are no bit errors in the memory. This process may be active all the time, with or without data traffic through the memory.

The solution according to the invention causes no extra delay, and demands no waiting periods. The complete memory can be checked for both stuck-at faults and crosstalk, not only locations currently in use. In addition, real parity errors do not affect the memory check.

In the case of a speech store in operation in a communication switch, a preferred embodiment of the invention incorporates a latch unit provided on the input side of the speech store. The data intended for a predetermined memory location in the speech store is temporarily stored in the latch unit, and instead a test pattern is stored in the speech store at the predetermined memory location. The test pattern can be checked when the memory location that holds the test pattern is selected and the contents of this location is requested in the operation of the communication switch, or when no data at all is requested from the speech store. Since, the test pattern has been written to this location, the correct data for this memory location is currently stored in the latch unit. Now, the data stored in the latch unit is forwarded as requested output data, and the test pattern is read and checked by a control unit.

With this arrangement, the maximum number of memory accesses will not increase, implicating that the highest read/write frequency can be maintained at the same level compared to prior art solutions. Besides, it is possible to reduce the number of faulty data words that are transmitted before a speech store experiencing a hardware failure is replaced. However, compared to the conventional through connection test, it should be noted that the complete connection path is not checked. Multiplexers and other interfaces must be maintained by other means.

In the case of a control store in operation in a communication switch, a preferred embodiment of the invention incorporates a latch unit provided on the output side of the control store. The data from a predetermined memory location in the control store is temporarily stored in the latch unit. When data has been read out of the predetermined memory location and stored in the latch unit, that location will be "free" and a test pattern can be written into the control store at the predetermined location. When the data in the predetermined test location is requested in the operation of the communication switch, the data stored in the latch unit is forwarded as requested output data and the content of the predetermined memory location is read and checked by a control unit. When the test has been completed, the data stored in the latch unit should be stored in the predetermined memory location once again, so that it can be read from the control store at a later time in accordance with the instructions from the control system of the communication switch. If there is an attempt to write new operational data to the memory location during the test, the new incoming data needs to be stored in the latch unit on the output side of the control store. The new data thus replaces the data previously stored in the latch unit.

Depending on whether the memory is a speech store or a control store, the implementation will be somewhat different. This implementational difference is due to the fact that when a control store is in operation data is constantly read from the control store and data is written to the control store only in some clock cycles when the contents of the control store need to be updated, while for a speech store data is constantly written into the speech store and the data is subsequently read from the speech store in accordance with the control information stored in the control store.

To summarize, the invention offers the following advantages:

continuous supervision of a memory in operation;

no extra delay;

possibility to check the complete memory for both stuck-at faults and crosstalk, not only locations currently in use;

real parity errors do not affect the memory check;

the maximum number of memory accesses will not increase; and reduction of the number of faulty data words that are transmitted before a memory experiencing a hardware failure is replaced.

Other advantages offered by the present invention will be appreciated upon reading of the below description of the embodiments of the invention.

BRIEF DESCRIPTION OF THE DRAWINGS

The invention, together with further objects and advantages thereof, will be best understood by reference to the following description taken together with the accompanying drawings, in which.

DETAILED DESCRIPTION

The invention will now be described with reference to a particular illustrative application of the invention, namely the testing of a memory, such as a speech store or a control store, in operation in a communication switch. However, the invention is not limited thereto, and it will be appreciated that the invention may be applied to other circuits and apparatuses provided with a memory.

For a better understanding of the invention, the general function of an illustrative communication switch, a time switch, will now be described by way of introduction.

Figure 1:
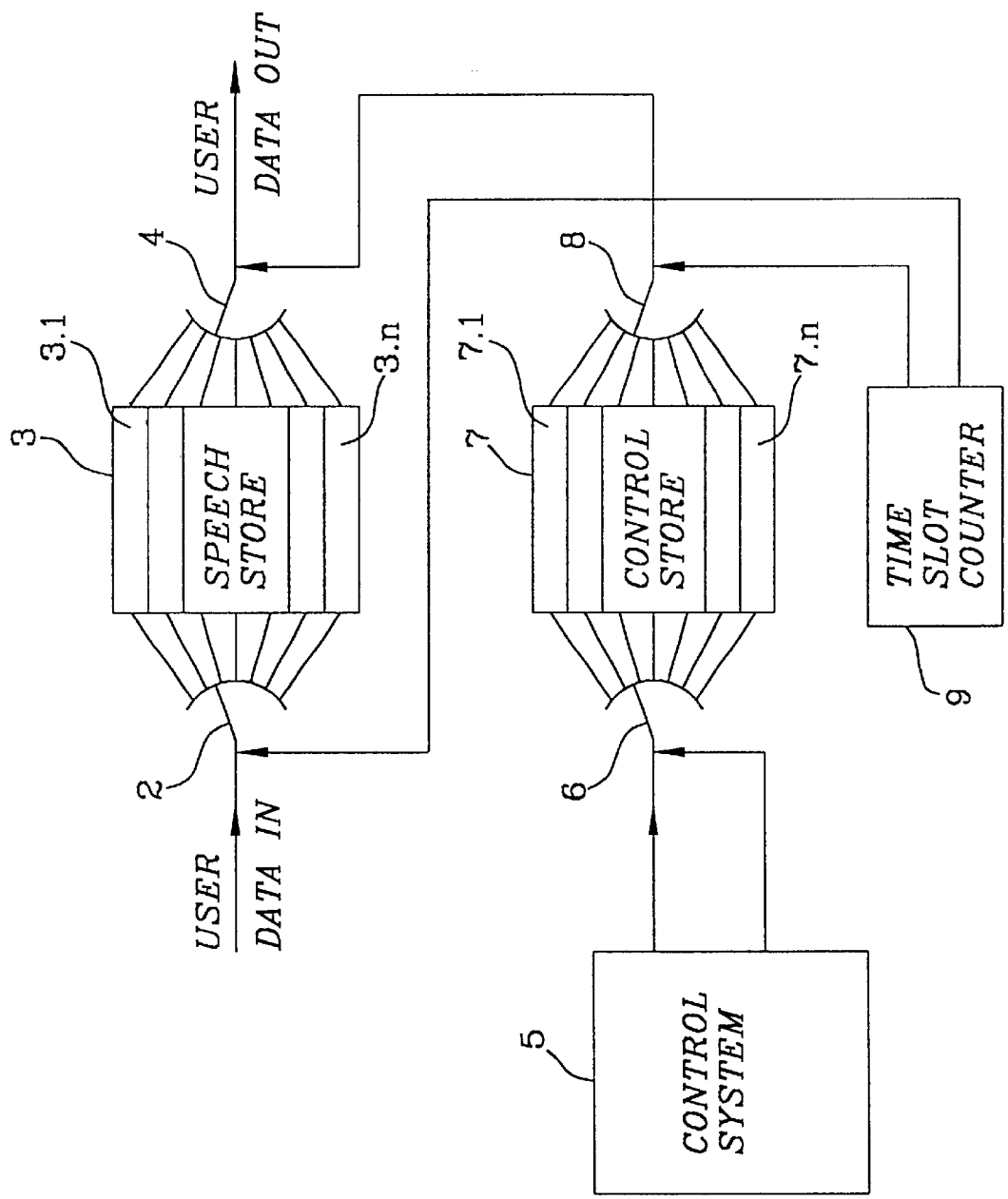
FIG. 1 is a schematic diagram of an illustrative time switch.

FIG. 1 is a schematic diagram of an illustrative time switch comprising a speech store 3 with associated addressing units 2 and 4, a control system 5, a control store 7 with associated addressing units 6 and 8, and a time slot counter 9.

User data from several connections are normally multiplexed by means of time multiplexing such that the user data is placed in time slots that are arranged in frames. In the time switch, the user data is moved between different time slots and frames by delaying the user data in the speech store 3. The delay is controlled by control information stored in the control store 7.

The speech store 3 comprises a number, n, of storage positions 3.1 to 3.n for storing the user data. Each storage position corresponds to a time slot and stores, during a certain time, a data word such as a byte. The control store 7 also includes a number, n, of storage positions 7.1 to 7.n, each of which corresponds to a time slot.

A multiplex from a group of user terminals arrives as incoming user data USER DATA IN to the addressing unit 2, which in turn is connected to the speech store 3. The speech store 3 is connected to the addressing unit 4 which acts as output of the time switch. The control system 5 is connected to the addressing unit 6, which in turn is connected to the control store 7. The control store 7 is also connected to the addressing unit 8. The addressing unit 8 of the control store 7 is connected to the addressing unit 4 of the speech store 3. The time slot counter 9 is connected to the addressing unit 2 of the speech store 3, and the addressing unit 8 of the control store 7.

The time slot counter 9 operates on the basis of a clock signal from a per se known and therefore not shown clock pulse generating unit, where each clock pulse corresponds to a time slot. The time slot counter 9 cyclically addresses storage positions in the control store 7 as well as in the speech store 3. By means of the time slot counter 9, via the addressing unit 2, the incoming user data USER DATA IN is cyclically written into the storage positions of the speech store 3 in a fixed sequence. The number, n, of storage positions in the speech store 3 is generally equal to the number of time slots in a frame. By way of example, the number of time slots in each frame may be 512 or 8192. Each storage position represents one and only one unique time slot in each frame. User data arriving in a certain incoming time slot in a frame is consequently stored in a given storage position corresponding to the incoming time slot. For each time slot, a storage position in the control store 7 is addressed via the addressing unit 8 for reading control information stored in the control store. The control information from the control store 7 in turn addresses the speech store 3 via the addressing unit 4 for reading outgoing user data USER DATA OUT from the speech store.

In the time switch, user data arriving to the time switch in given time slots relative to the frames are normally, but not always, delayed and goes out of the time switch in other time slots relative to the frames.

The control information controlling the time switch is generated by means of the control system 5, which may be a computer program-controlled control system being part of the time switch or the overall telecommunication system. The control information is written into the storage positions of the control store 7 via the addressing unit 6 under the control of the control system 5. The number, n, of storage positions in the control store 7 is equal to the number of time slots in a frame. By means of the time slot counter 9, via the addressing unit 8, the control information stored in the control store 7 is cyclically read-out of the control store in a fixed sequence, one unique storage position for each time slot in a frame. In each time slot, the control information from the control store 7 addresses the addressing unit 4 of the speech store 3, and this control information indicates from which storage position of the speech store 3 that user data is to be read, and in that way appear as output data USER DATA OUT in outgoing time slots.

It is important that the speech store and control store of the time switch operate properly, and in operation, it is desirable to supervise the speech store and control store so that they can be promptly replaced in the case of a hardware failure.

The basic idea according to the invention is to connect a storage unit, preferably an external one-word memory, to the memory to be supervised. The storage unit is used to temporarily free a memory location in the memory to be tested so that a test pattern can be written into the memory location and read out again. If there is a mismatch between the written pattern and the pattern read from the tested memory location an alarm is raised. According to a preferred embodiment of the invention, the test procedure is coordinated with the normal operation of the memory.

Now, implementations of the basic idea according to preferred embodiments of the invention will be described with reference to FIGS. 2–7.

An Illustrative Implementation for a Speech Store

Figure 2:
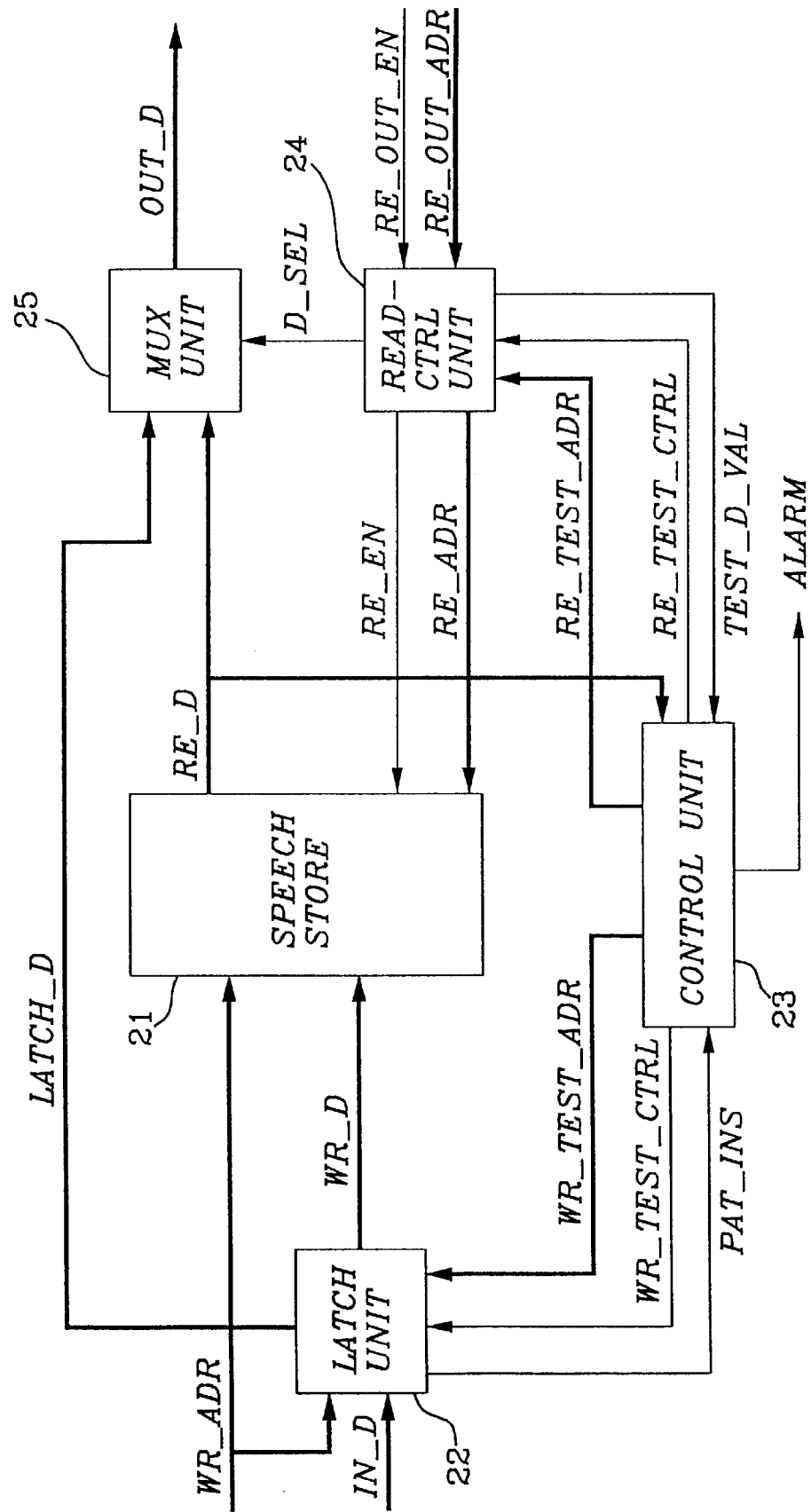
FIG. 2 is a schematic diagram of a speech store and a system for testing memory locations of the speech store according to a first preferred embodiment of the invention.

FIG. 2 is a schematic diagram of a speech store and a system for testing memory locations of the speech store according to a first preferred embodiment of the invention. The speech store 21 is preferably arranged in a communication switch such as that shown in FIG. 1. The system associated with the speech store 21 generally comprises a latch unit 22, a control unit 23, a read control unit 24 and a multiplexor unit 25.

The speech store 21 is generally a RAM (Random Access Memory) which stores user data from incoming time slots. WR_ADR (Write Address) determines the write address to which user data on WR_D (Write Data) is written. Data is read out of the speech store 21 on RE_D from the read address determined by RE_ADR (Read Address) if RE_EN (Read Enable) is high. If RE_EN is low, the previous data remains on RE_D.

In the implementation of FIG. 2, the latch unit 22 is provided on the input side of the speech store 21. The latch unit 22 is normally transparent to the traffic of data and transmits incoming data on IN_D (In Data) to WR_D. In the test procedure, the control unit 23 selects a memory location in the speech store 21 as a test address WR_TEST_ADR. When the latch unit 22 recognizes that the test address WR_TEST_ADR and the write address WR_ADR points to the same memory location, the data in the current time slot is stored in the latch unit 22, and put on LATCH_D (Latched Data). Now, instead of the data in the time slot, the latch unit 22 puts a test pattern on WR_D such that the test pattern is stored in the speech store 21 at the test address. PAT_INS (Pattern Inserted) goes high. If more than one test pattern is available, WR_TEST_CTRL (Write Test Control) determines which test pattern to use.

Now, the control unit 23 wants the read control unit 24 to read the data from the test address. When PAT_INS is high, the control unit 23 knows that the test pattern has been written to the selected memory location of the speech store 21, and RE_TEST_CTRL (Read Test Control) is set high to tell the read control unit 24 that the control unit 23 wants to read data from the test address. In operation, the test pattern can be checked when an external unit wants the contents of the test address on OUT_D (Out Data). When RE_OUT_EN (Read Out Enable) is high, an external unit wants data on OUT_D. The read control unit 24 puts the address on RE_OUT_ADR (Read Out Address) through to RE_ADR. The speech store 21 is instructed to put the contents of the selected memory location on RE_D by setting RE_EN high. Since, the test pattern has been sent to the test address, and the correct data is stored in the latch unit 22 and put on LATCH_D, the data on LATCH_D has to be put through to OUT_D instead of RE_D. This is executed by the multiplexor unit 25 under the control of the read control unit 24. The read control unit 24 makes sure the right data is sent out by comparing RE_TEST_ADR (Read Test Address) from the control unit 23 to RE_OUT_ADR, and if they are equal, setting D_SEL (Data Select) high to select LATCH_D as output to OUT_D. At the same time, the read control unit 24 signals to the control unit 23 by means of TEST_D_VAL (Test Data Valid) to read the data on RE_D. The control unit 23 compares the written test pattern to the data on RE_D, and if there is a mismatch, an ALARM is raised.

Another chance to check the test pattern is when no external unit wants data on OUT_D, which means that RE_OUT_EN is low. If the control unit 23 has received a high PAT_INS signal, there is an unchecked pattern in the speech store at the selected test location, and RE_TEST_CTRL is high, telling the read control unit 24 that the control unit 23 wants to read the content of the test location. The read control unit 24 puts the address on RE_TEST_ADR from the control unit 23 through to RE_ADR to select the test location. RE_EN is high to signal to the speech store 21 that data is requested on RE_D. TEST_D_VAL is set high, and the data on RE_D is read and compared to the written test pattern by the control unit 23. If the patterns are not equal, an ALARM signal is raised.

The control unit 23 decides which memory locations to test, and in which order the memory locations are checked. For example, by constantly repeating the above process for all memory locations of the speech store, and testing the locations with two complementary test patterns, a continuous check of each memory cell in the speech store for stuck-at faults is obtained. Such a testing will also result in an ALARM if there are bit errors due to stuck-at faults or cross-talk on any of WR_D, RE_D, WR_ADR or RE_ADR.

If the test location is not read during the period of a frame, the test location might escape being checked. This can only happen if the speech store is used in a broadcasting application, where some of the memory locations are read more than once in a frame period. In this case, the memory location that escapes testing is currently not being used, and stuck-at faults in unchecked locations will not cause bit errors in the data traffic until the memory location is put into use. When the memory location starts being used in a connection, it will be tested in a short while.

An Illustrative Implementation for a Control Store

Figure 3:
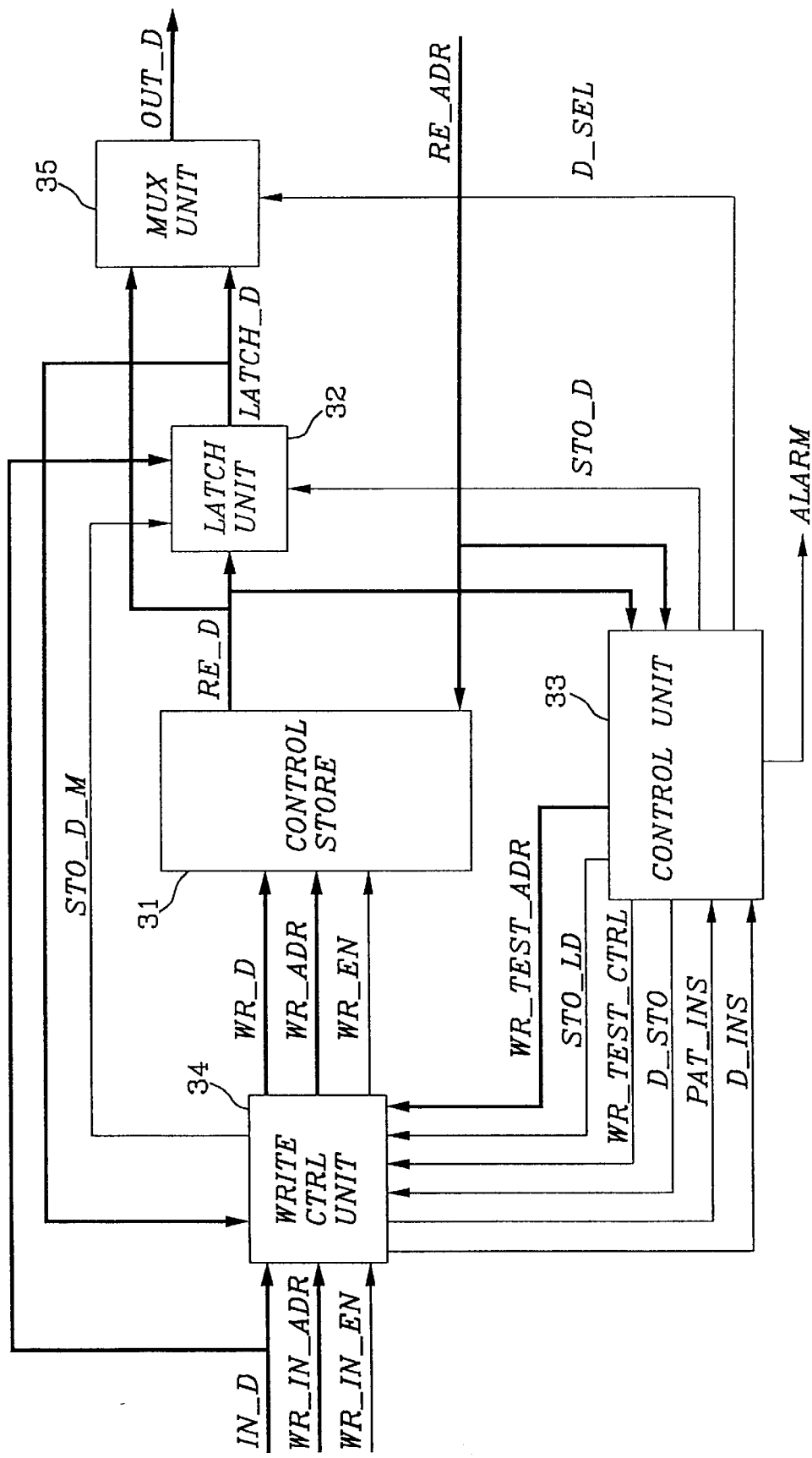
FIG. 3 is a schematic diagram of a control store and a system for testing memory locations of the control store according to a second preferred embodiment of the invention.

FIG. 3 is a schematic diagram of a control store and a system for testing memory locations of the control store according to a second preferred embodiment of the invention. The control store 31 is preferably arranged in a communication switch such as that shown in FIG. 1. The system associated with the control store 31 generally comprises a latch unit 32, a control unit 33, a write control unit 34 and a multiplexor unit 35.

The control store 31 is generally a RAM which stores control information regarding the switching of time slots. The control information is written to the control store 31 by the control system (not explicitly shown in FIG. 3) of the communication switch. The contents of the control store 31 is updated when necessary in accordance with the instructions from the control system. The write control unit 34 writes data to the control store 31. Most of the time, the write control unit 34 is transparent to the external signals IN_D (In Data), WR_IN_ADR (Write In Address) and WR_IN_EN (Write In Enable) which are then put through to WR_D, WR_ADR and WR_EN respectively. WR_IN_ADR_WR_ADR determines the write address to which data on WR_D is written.

The control information is constantly read from the control store 31 in a cyclical manner such that all memory locations are read consecutively with a predetermined interval. Data is read from the control store 31 on RE_D (Read Data) from the read address determined by RE_ADR (Read Address).

In the implementation of FIG. 3, a latch unit 32 is provided on the output side of the control store 31. In the test procedure, a control unit 33 selects a memory location in the control store 31 as a test address WR_TEST_ADR (Write Test Address), and selects a test pattern by WR TEST_CTRL (Write Test Control). Now, the control unit 33 waits for the read address on RE_ADR to become equal to the test address. When the two addresses are equal, the control unit 33 sends a high STO_D (Store Data) signal to the latch unit 32 and sets D_STO (Data Stored) high. When STO_D is high, the data on RE_D is stored in the latch unit 32 and put on LATCH_D, which means that the data stored at the test address in the control store 31 will now also be stored in the latch unit 32. Now, the test pattern can be written to the test address.

There are two ways the test pattern can be written to test address in the control store 31. One way is to store the test pattern in the test address when there is an attempt to write new data to the test address from the outside. Then the new data on IN_D is stored in the latch unit 32 instead of the data previously stored in the latch unit, and the test pattern is stored in the test address in the control store 31. The write control unit 34 remains transparent to WR_IN_EN and WR_IN_ADR in this clock cycle, and the test pattern is put on WR_D by the write control unit 34. STO_D_M (Store Data Master) is set high for one clock cycle, signaling to the latch unit 32 to store the data on IN_D. This procedure is similar to that for the speech store 21 of FIG. 2, where data addressed for the memory location to be tested is stored in the latch unit 22 of FIG. 2, and instead a test pattern is written into the test location. It is important to note that in comparison to STO_D, STO_D_M has the highest priority when both signals go high at the same time, meaning that if STO_D_M is high any signal on STO_D is ignored.

The other way the test pattern can be written to the control store 31 is to store the test pattern in the test address when no data is written to the control store 31 from the outside. The write control unit 34 waits for WR_IN_EN to go low, and then stores the test pattern in the test address. In either case, the write control unit 34 sets PAT_INS (Pattern Inserted) high for one clock cycle when the test pattern has been stored at the test address of the control store 31.

If there is an attempt to write to the test address before the data has been stored in the latch unit 32, the data for the test address will be sent to the latch unit 32, and the test pattern will be inserted by the write control unit 34. In this case, the control unit 33 will receive a high PAT_INS signal before it has set D_STO high.

When the test pattern has been inserted and the control unit 33 has received a high PAT_INS signal, the control unit 33 sets D_STO low and once again waits for the read address RE_ADR to become equal to the test address WR_TEST_ADR, which means that the data at the test address is put on RE_D. When this happens, the control unit 33 compares the data on RE_D to the written test pattern. If the bit patterns are different, an alarm signal is issued on ALARM.

It should be understood that in the clock cycle when the test address is read, the D_SEL signal to the multiplexor unit 35 is set high such that the latched data on LATCH_D is put through to OUT_D instead of the contents of the test address (on RE_D).

When the test has been completed, the data stored in the latch unit 32 has to be stored in the tested memory location again. The control unit 33 sets STO_LD (Store Latched Data) high and keeps it high until the write control unit 34 has stored the data on LATCH_D in the tested memory location. When STO_LD goes high, the write control unit 34 waits for WR_IN_EN to go low and then the data in the latch unit 32 is written to the test address. When the correct data has been stored in the tested memory location, D_INS (Data Inserted) goes high. Due to the fact that an attempt to write new data to the test address during the test period will result in this new data being stored in the latch unit 32 instead of the previous data, the most recently updated data will always be put back into the tested memory location after the test period has been completed.

Preferably, the test starts again with another test address or with a complementary test pattern for the same test address. In a particular embodiment, the test should be running constantly, repeatedly testing all addresses with two complementary patterns. Such a testing will also result in an ALARM if there are bit errors due to stuck-at faults or cross-talk on any of WR_D, RE_D, WR_ADR or RE_ADR.

Signal Timing

Figure 4A:
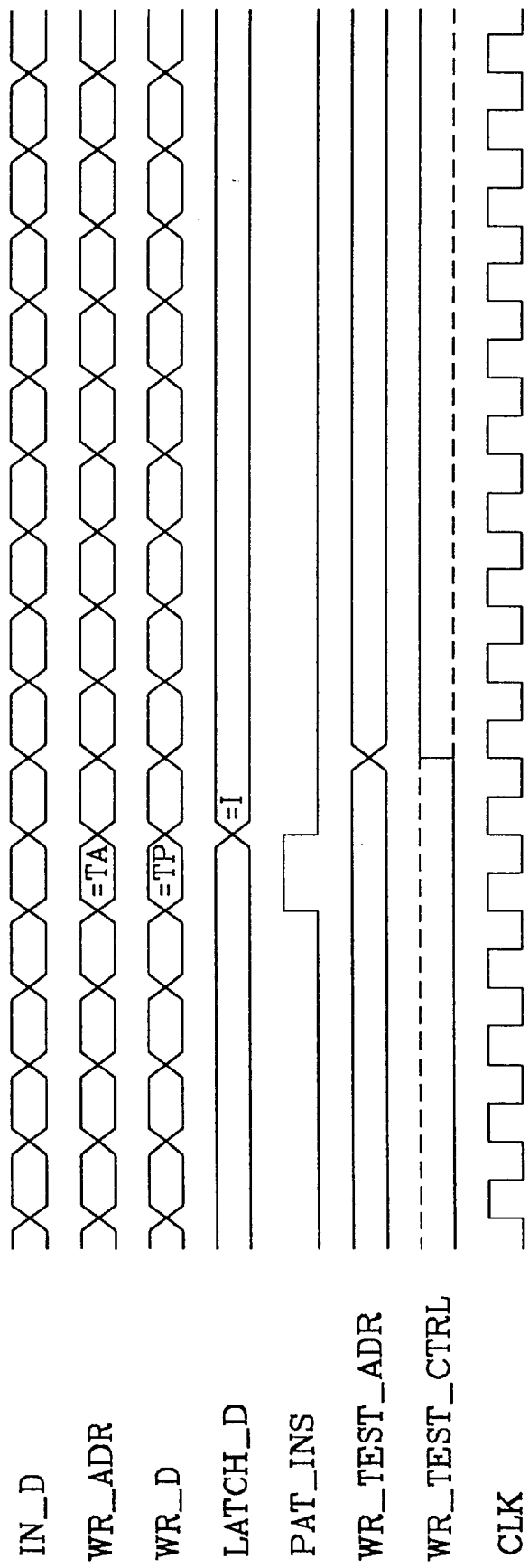
FIGS. 4A–C are schematic illustrative timing diagrams of the signals relevant to the implementation of FIG. 2.
Figure 4B:
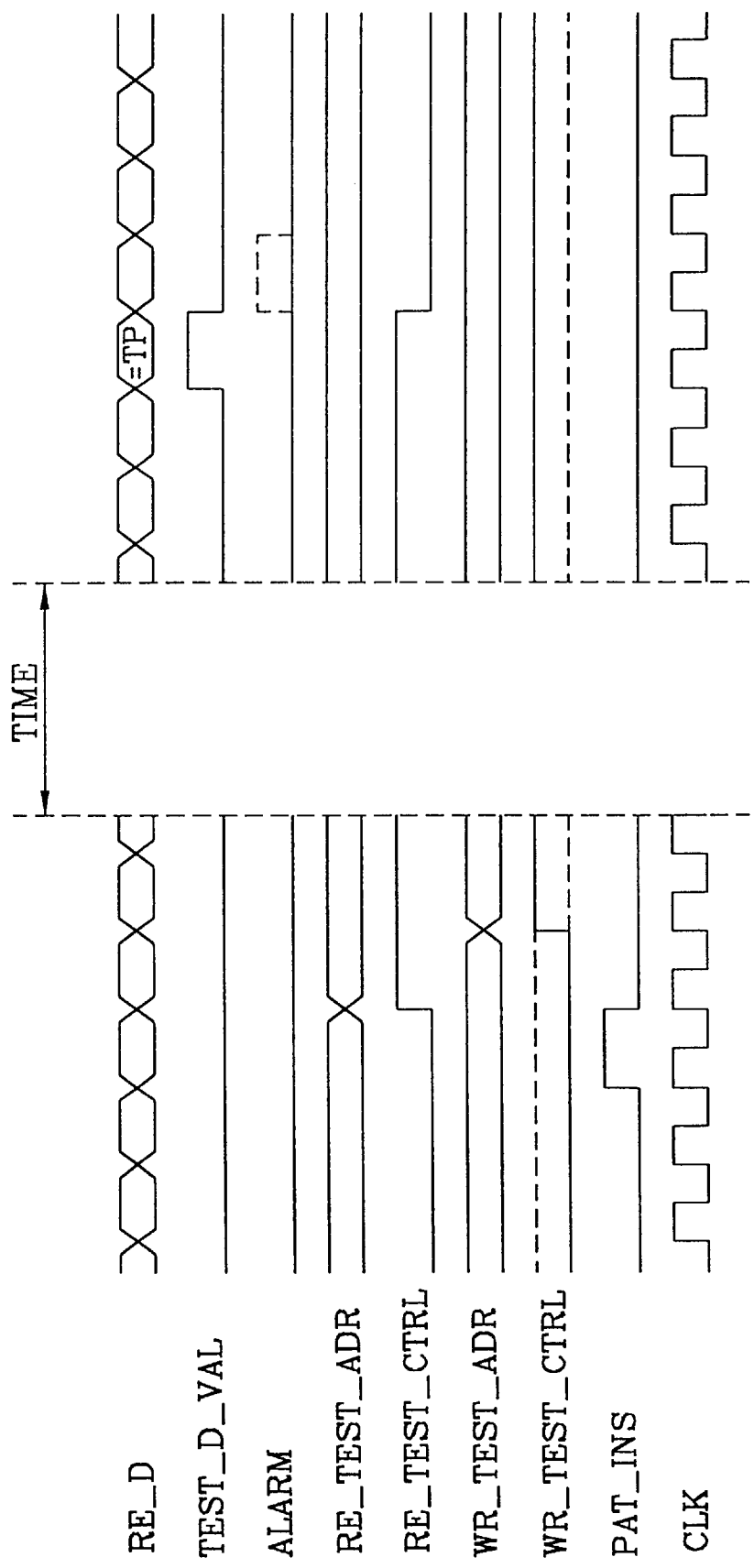
Figure 4C:
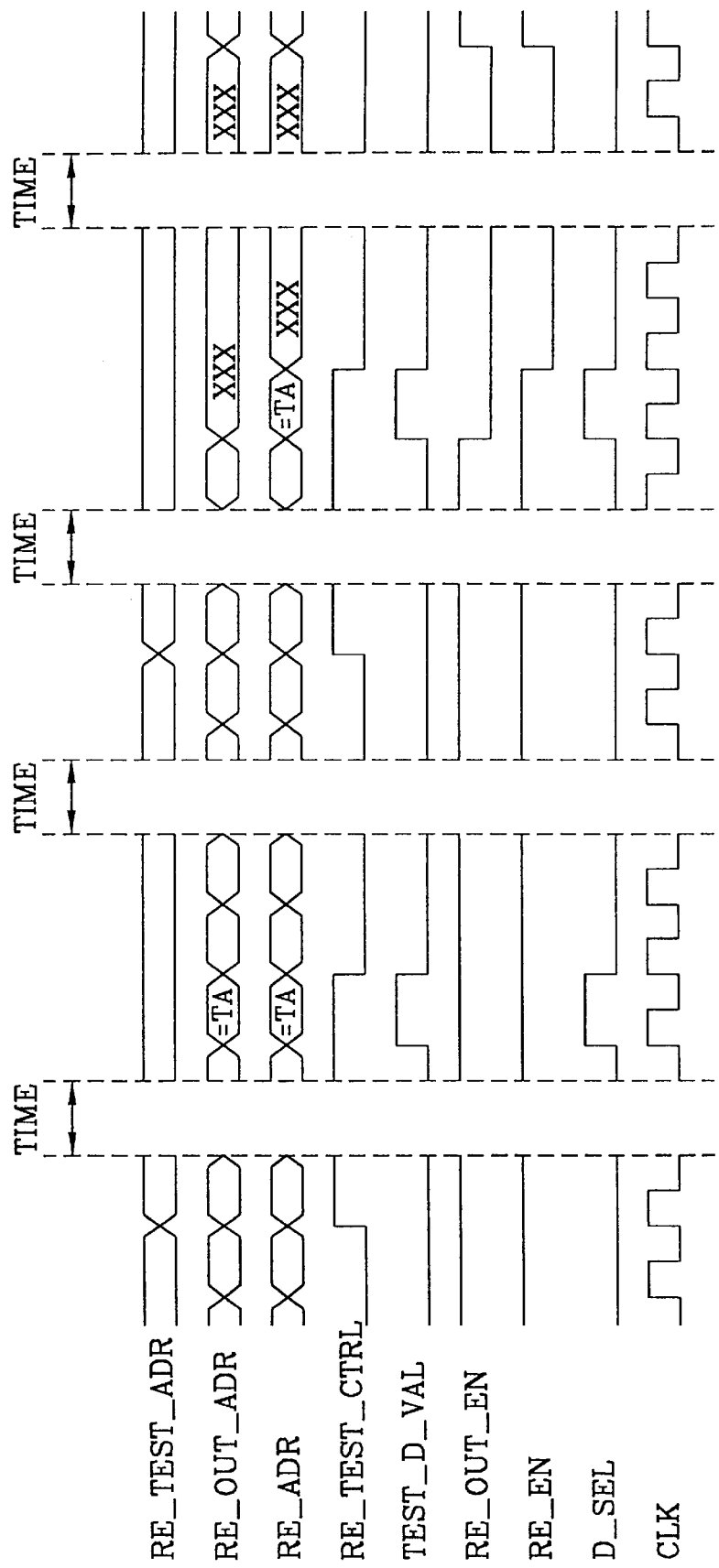

FIGS. 4A–C are schematic illustrative timing diagrams of the signals relevant to the implementation of FIG. 2.

FIG. 4A is a signal timing diagram relevant to the latch unit 22 of FIG. 2. The designation "=TA" in the signal WR_ADR means that the write address is equal to the test address. The designation "=TP" in the signal WR_D means that the write data is the test pattern. The signal PAT_INS is high. The designation "=I" in the signal LATCH_D means that the data of IN_D that was read the previous clock cycle is put on LATCH_D. When there is a change in WR_TEST_CTRL, the test pattern has changed.

FIG. 4B is a signal timing diagram relevant to the control unit 23 of FIG. 2. The designation "=TP" in the signal RE_D means that the read data is equal to the test pattern. However, if the data on RE_D at the clock cycle indicated by "=TP" is not equal to the test pattern, the signal ALARM goes high (indicated by dotted lines).

FIG. 4C is a signal timing diagram relevant to the read control unit 24 of FIG. 2. The designation "XXX" means that the data is undetermined. The designation "=TA" in the signals RE_OUT_ADR and RE_ADR means that the read address is equal to the test address. FIG. 4C illustrates two ways to perform the test. The first two sectors from the left show a test occurring when the external read address is equal to the test address and RE_OUT_EN is high. The three remaining sectors show a test occurring when the speech store is not read externally for a number of clock cycles and RE_OUT_EN goes low.

FIGS. 5A–E are schematic illustrative timing diagrams of the signals relevant to the implementation of FIG. 3.

Figure 5A:
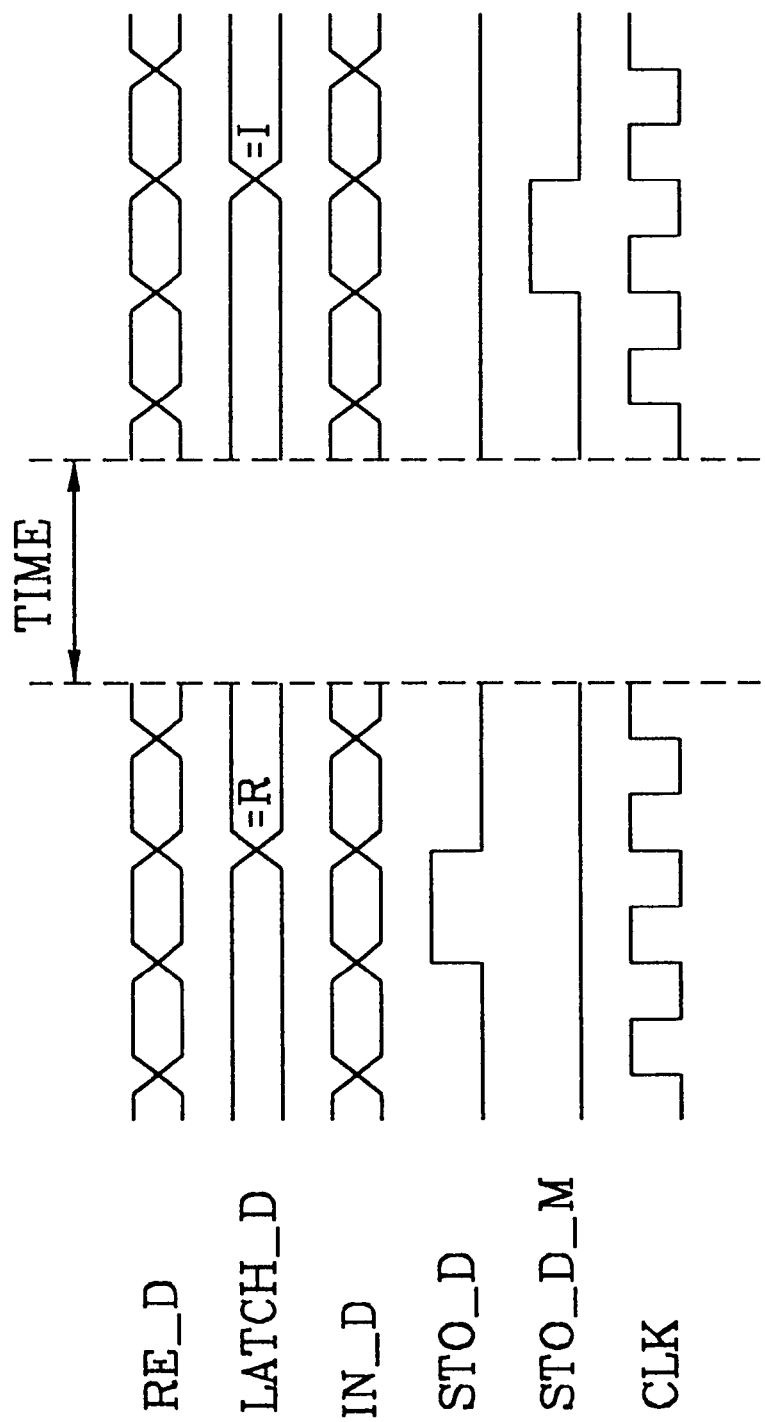
FIGS. 5A–E are schematic illustrative timing diagrams of the signals relevant to the implementation of FIG. 3.

FIG. 5A is a signal timing diagram relevant to the latch unit 32 of FIG. 3. The designation "=R" in the signal LATCH_D means that the data on RE_D is put on LATCH_D. The designation "=I" in the signal LATCH_D means that the data on IN_D is put on LATCH_D. FIG. 5A illustrates two ways of loading the latch unit 32 with data, loading from RE_D (case 1) and from IN_D (case 2). The part with LATCH_D marked "=R" corresponds to case 1, the other part marked "=I" to case 2.

Case 1: WR_IN_EN goes low for a number of clock cycles and the control store is free for writing.

Case 2: WR_ADR is equal to the test address for a clock cycle, which makes writing to the test address possible.

Figure 5B:
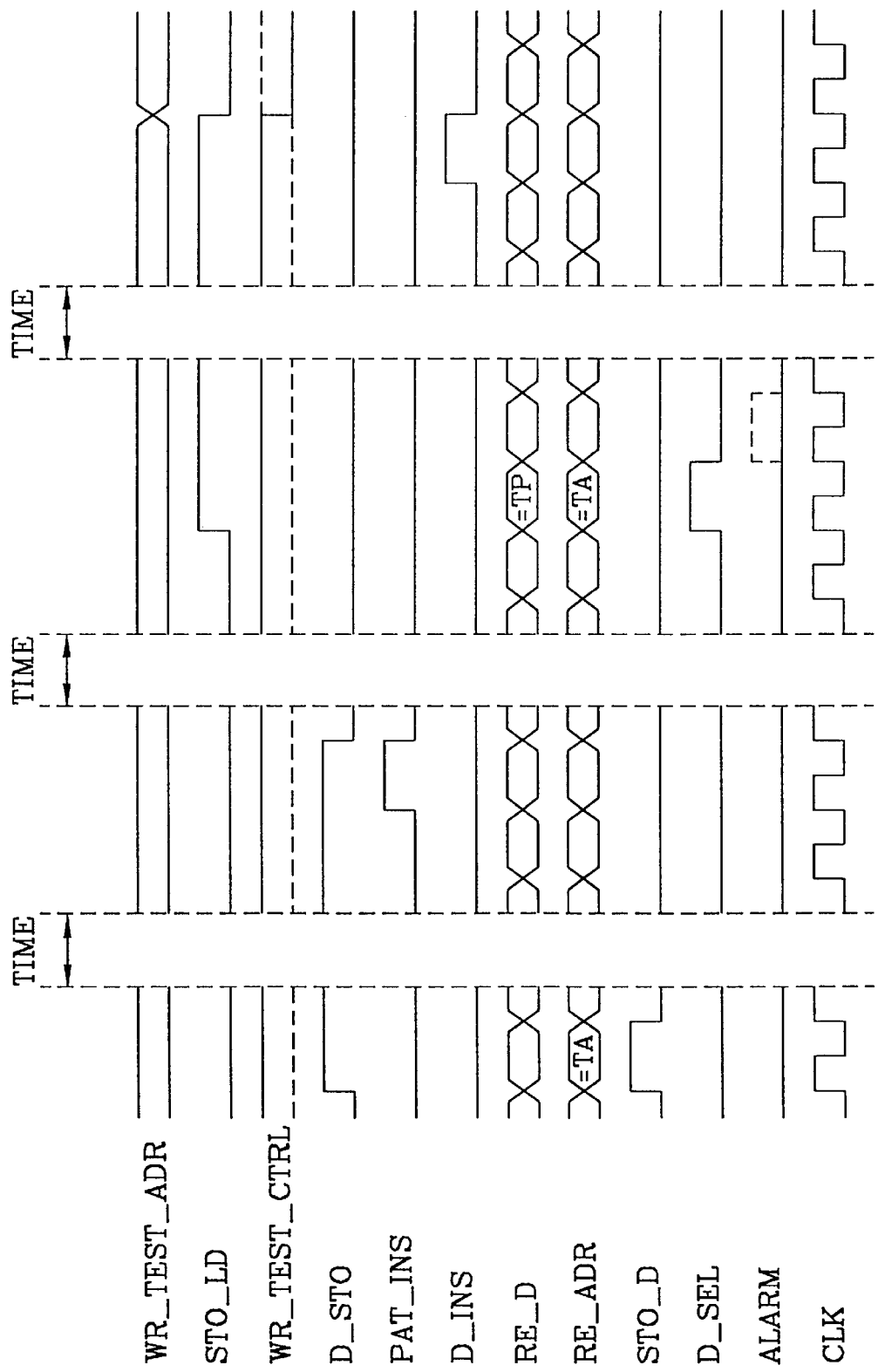

FIG. 5B is a signal timing diagram for case 1 relevant to the control unit 33 of FIG. 3. The designation "=TA" in the signal RE_ADR means that the read address is equal to the test address. The designation "=TP" in the signal RE_D means that the read data is equal to the test pattern. However, if the data on RE_D at the clock cycle indicated by "=TP" is not equal to the test pattern, the signal ALARM goes high (indicated by dotted lines).

Figure 5C:
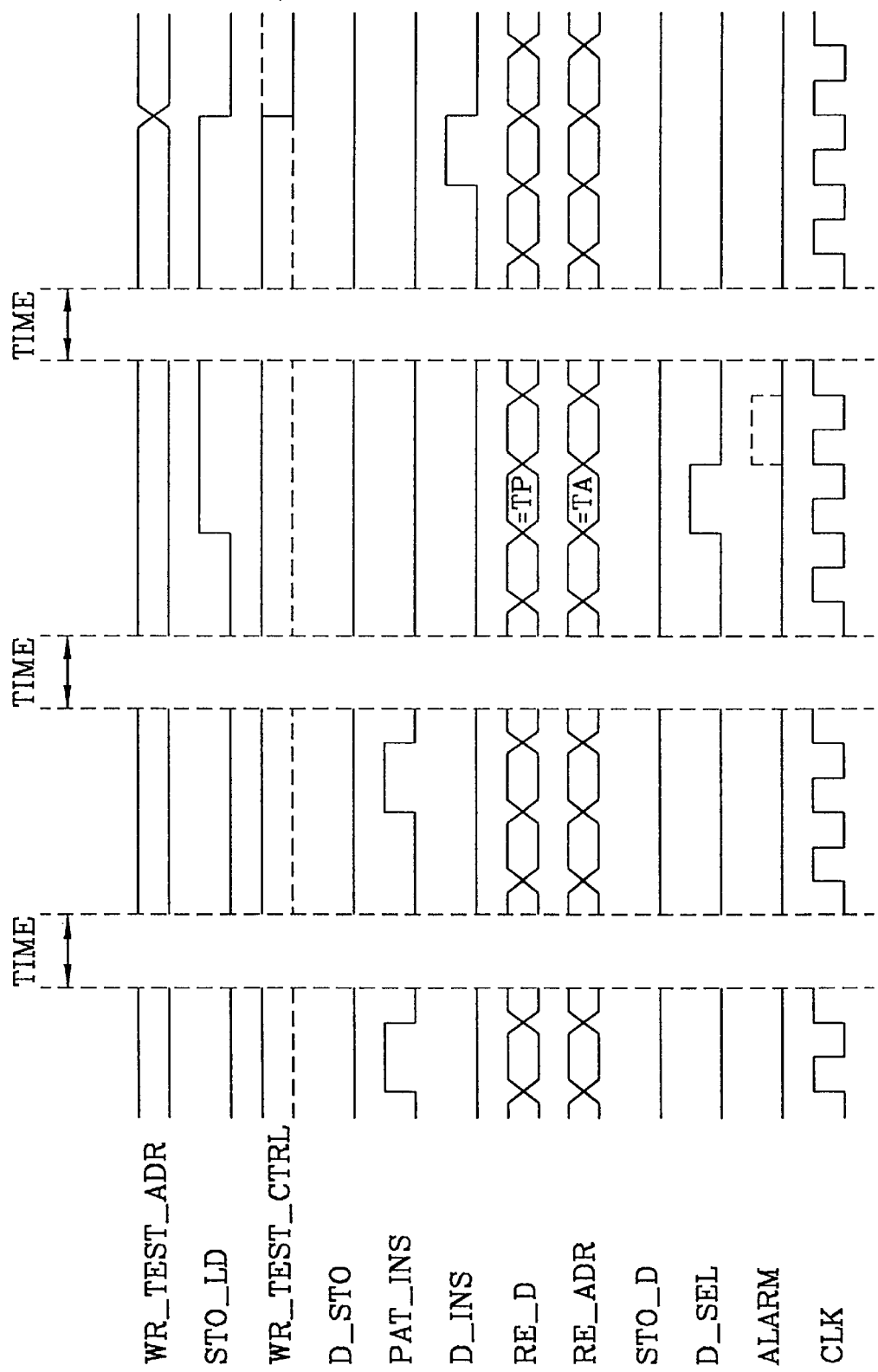

FIG. 5C is a signal timing diagram for case 2 relevant to the control unit 33 of FIG. 3. The designation "=TA" in the signal RE_ADR means that the read address is equal to the test address. The designation "=TP" in the signal RE_D means that the read data is equal to the test pattern. However, if the data on RE_D at the clock cycle indicated by "=TP" is not equal to the test pattern, the signal ALARM goes high (indicated by dotted lines). The first two sectors are similar, illustrating that there might be more than one word written to the test address before the test is over.

Figure 5D:
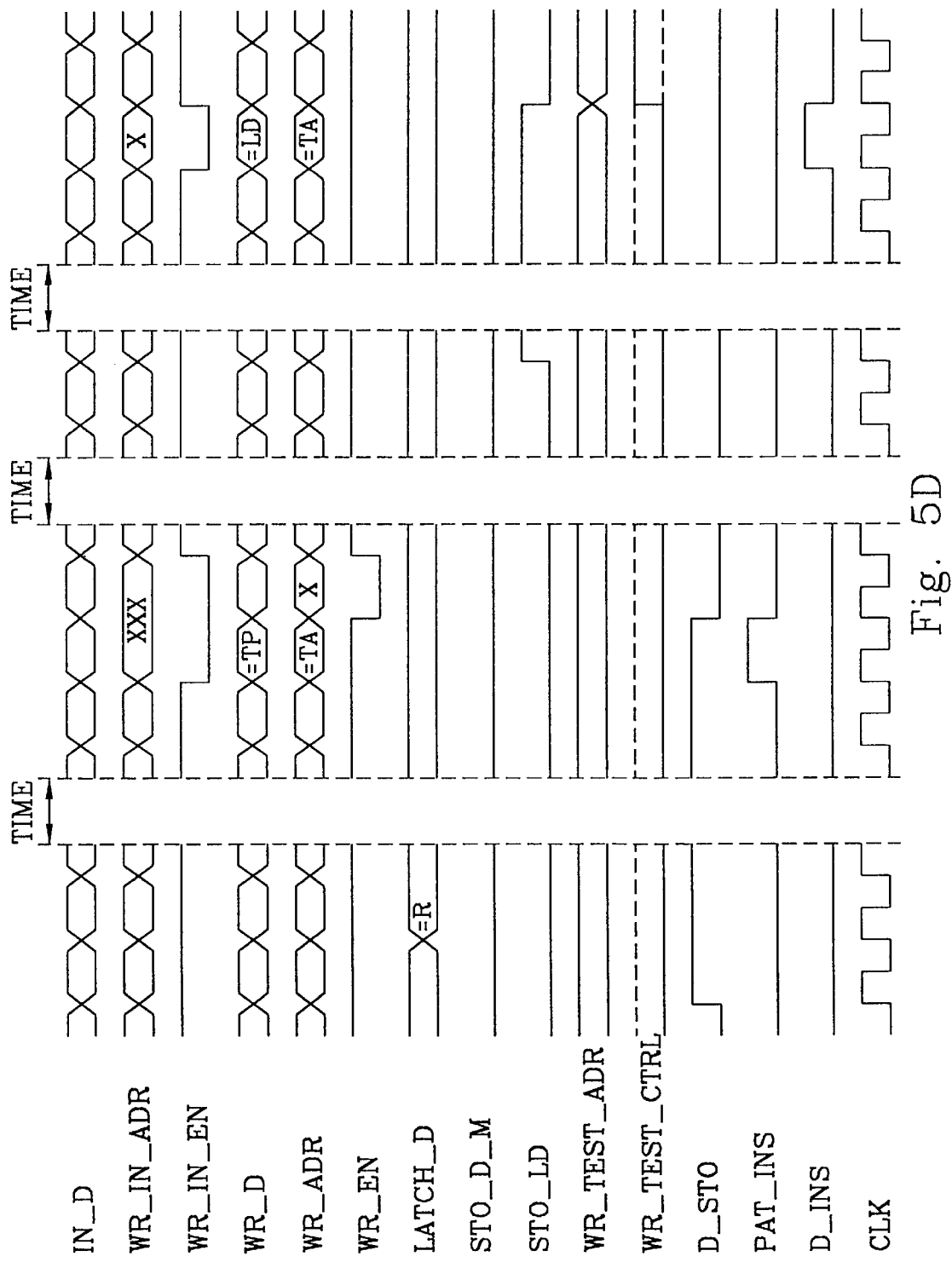

FIG. 5D is a signal timing diagram for case 1 relevant to the write control unit 34 of FIG. 3. The designation "=R" in the signal LATCH_D means that the data on RE_D is put on LATCH_D. The designation "XXX" means that the data is undetermined. The designation "=TA" in the signal WR_ADR means that the write address is equal to the test address. The designation "=TP" in the signal WR_D means that the write data is the test pattern. The designation "=LD" in the signal WR_D means that the write data is the data on LATCH_D.

Figure 5E:
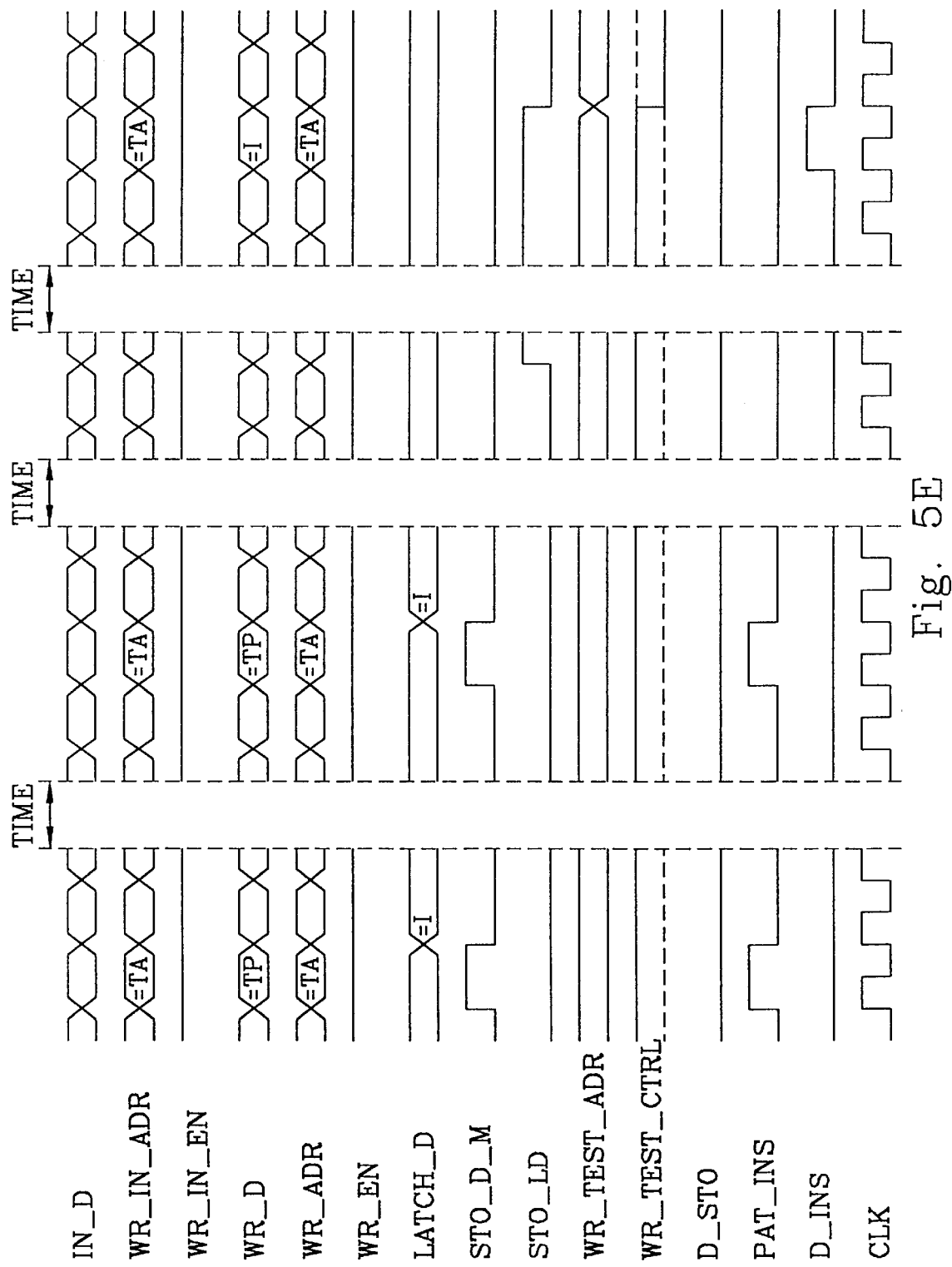

FIG. 5E is a signal timing diagram for case 2 relevant to the write control unit 34 of FIG. 3. The designation "=TA" in the signals WR_IN_ADR and WR_ADR means that the write address is equal to the test address. The designation "=TP" in the signal WR_D means that the write data is the test pattern. The designation "=I" in the signal WR_D means that the write data is the data on IN_D. The designation "=I" in the signal LATCH_D means that the data on IN_D is put on LATCH_D. The first two sectors are similar, illustrating that there might be more than one word written to the test address before the test is over.

It should be understood that only the principles of different cases are described above, not all possible cases.

Description of Flow Diagrams

Figure 6:
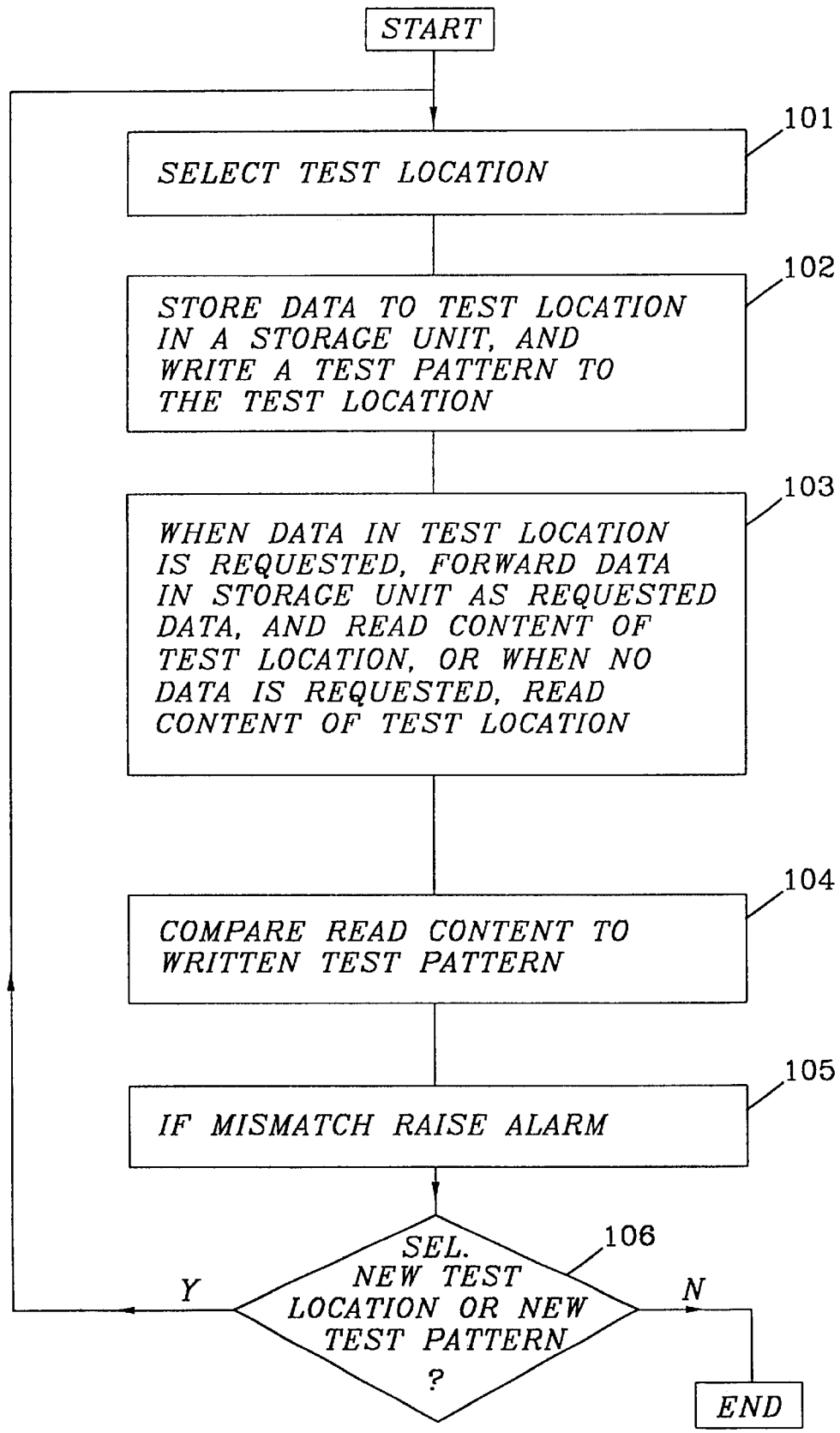
FIG. 6 is a schematic flow diagram of a method for testing a memory according to a preferred embodiment of the invention.

FIG. 6 is a schematic diagram of a method for testing a memory according to a preferred embodiment of the invention. The memory to be tested is preferably a speech store which has a number of memory locations. In step 101, a memory location in the memory is selected as a test location. In step 102, when, in operation, data is to be written to the selected memory location, this data is temporarily stored in a storage unit such as an external one-word memory, and instead a test pattern is written to the selected memory location. In step 103, when data in the selected memory location is requested in the operation, the data stored in the storage unit is forwarded as requested output data, and the content of the selected memory location is read. Alternatively, the content of the selected memory location is read when no data is requested from the memory. In step 104, the content read from the selected memory location is compared to the written test pattern, and in step 105, an alarm is raised if there is a mismatch.

The steps 101–105 can be repeated for the same test location, but with a further complementary test pattern. In addition, it is possible to repeat the steps 101–105 for all memory locations of the memory. These options are indicated at 106. Preferably, steps 101–105 are repeated continuously with two complementary patterns to obtain a continuous supervision of the memory.

Figure 7:
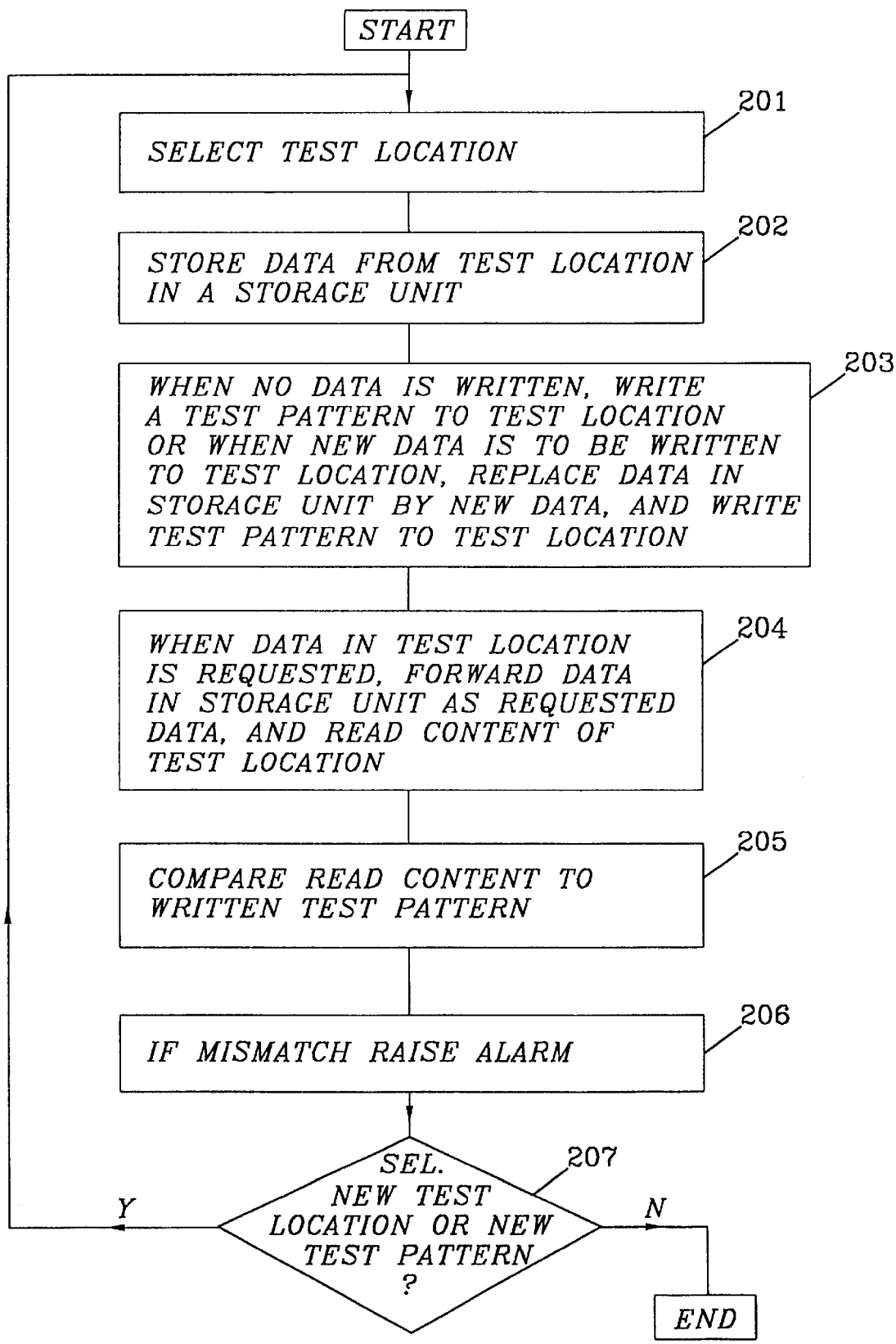
FIG. 7 is a schematic flow diagram of a method for testing a memory according to another preferred embodiment of the invention.

FIG. 7 is a schematic diagram of a method for testing a memory according to another preferred embodiment of the invention. In step 201, a memory location in the memory to be tested is selected as a test location. In step 202, when data in the selected memory location is requested in the operation, this data is stored in a storage unit such as an external one-word memory, and the data now stored in the storage unit is forwarded as the requested output data. In step 203, when no data is written to the memory, a test pattern is written to the selected memory location. Alternatively, when new data is to be written to the selected memory location, the data previously stored in the storage unit is replaced by the new data, and then the test pattern is written to the selected memory location. In step 204, when data in the selected memory location once again is requested in the operation, the data stored in the storage unit is forwarded as the requested output data and the content of the selected memory location is read. In step 205, the content read from the selected memory location is compared to the written test pattern, and in step 206, an alarm is raised if there is a mismatch.

Preferably, the data stored in the storage unit is written back into the selected memory location after the test of that memory location has been completed.

The steps 201–206 can be repeated for the same test location, but with a further complementary test pattern. In addition, it is possible to repeat the steps 201–206 and the step of returning, after the test, the data in the storage unit to the tested location, for all memory locations of the memory. These options are indicated at 207. Preferably, steps 201–206 are repeated continuously with two complementary patterns to obtain a continuous supervision of the memory.

Although the embodiments above are envisaged for memories that have one input port and one output port, it is of course possible to apply the invention, in all its aspects, to multiple port memories as well. It is sometimes desirable to use a type of memory that has more than one output port, i.e. a multiple port memory, such that two or more memory addresses can be read at the same time.

Another situation is when several similar memories in a circuit are to be tested, for example when a single-port memory (one input port and one output port) is duplicated in order to allow two or more memory addresses to be read at the same time. If the duplicated memories hold the same data (relevant to the speech store implementation of FIG. 2), a common latch unit can be used in testing all the memories, instead of a separate latch unit for each memory. The signal LATCH_D from the common latch unit is then distributed to the multiplexors associated with the duplicated memories, and the signal WR_D from the latch unit and the signal WR_ADR are distributed to the memories. In addition, by using the same test address for all the duplicated memories, a common control unit can be used instead of a separate control unit for each memory. In this case however, the alarm function is preferably moved from the control unit to an appropriate unit that still is assigned to each memory, e.g. the read control unit in the case of a speech store, such that a separate alarm can be given for each memory.. Of course, the signaling will be modified accordingly.

The embodiments described above are merely given as examples, and it should be understood that the present invention is not limited thereto. Further modifications, changes and improvements which retain the basic underlying principles disclosed and claimed herein are within the scope and spirit of the invention.

What is claimed is:

1. A method for testing a memory in operation, the memory having a number of memory locations, the method comprising the steps of:
   a) selecting a memory location in the memory as a test location;
   b) when, in operation, data is to be written to the selected memory location, temporarily storing the data in a storage unit, and instead writing a test pattern into the selected memory location;
   c) when data in the selected memory location is requested in the operation, forwarding the data stored in the storage unit as requested output data, and reading the content of the selected memory location in the memory, or when no data is requested from the memory, reading the content of the selected memory location;
   d) comparing the content read from the selected memory location to the written test pattern; and
   e) selectively, in dependence on the result of the comparison, raising an alarm.

2. A method for testing a memory according to claim 1, wherein the storage unit is an external one-word memory.

3. A method for testing a memory according to claim 1, wherein the steps b–e are repeated with a further complementary test pattern.

4. A method for testing a memory according to claim 1, wherein the steps a–e are repeated for all memory locations of the memory.

5. A method for testing a memory according to claim 1, wherein the memory is a speech store in operation in a communication switch.

6. A method for testing a memory in operation, the memory having a number of memory locations, the method comprising the steps of:
   a) selecting a memory location in the memory as a test location;
   b) when data in the selected memory location is requested in the operation, temporarily storing the data in the selected memory location in a storage unit, and forwarding the data now stored in the storage unit as requested output data;
   c) when no data is written to the memory, writing a test pattern into the selected memory location, or when new data is to be written to the selected memory location, replacing the data previously stored in the storage unit by the new data, and writing the test pattern into the selected memory location;
   d) when data in the selected memory location once again is requested in the operation, forwarding the data stored in the storage unit as requested output data and reading the content of the selected memory location in the memory;
   e) comparing the content read from the selected memory location to the written test pattern; and
   f) selectively, in dependence on the result of the comparison, raising an alarm.

7. A method for testing a memory according to claim 6, further comprising the step g) of writing, after the test of the selected memory location has been completed, the data stored in the storage unit into the selected memory location of the memory.

8. A method for testing a memory according to claim 7, wherein the steps b–g are repeated with a further complementary test pattern.

9. A method for testing a memory according to claim 7, wherein the steps a–g are repeated for all memory locations of the memory.

10. A method for testing a memory according to claim 6, wherein the storage unit is an external one-word memory.

11. A method for testing a memory according to claim 6, wherein the memory is a control store in operation in a communication switch.

12. A system for testing a memory in operation, the memory having a number of memory locations, the system comprising:
   a control unit for selecting a memory location in the memory as a test location;
   means for temporarily holding data intended for the selected memory location and for forwarding a test pattern to the selected memory location when, in operation, data is to be written to the selected memory location;
   means for reading the content of the selected memory location in the memory when data in the selected memory location is requested in the operation, or when no data is requested from the memory;
   means for forwarding the data held in said means for temporarily holding as requested output data when data in the selected memory location is requested in the operation; and
   means for comparing the content read from the selected memory location to the forwarded test pattern and for selectively, in dependence on the result of the comparison, raising an alarm.

13. A system for testing a memory according to claim 12, wherein said means for temporarily holding and for forwarding a test pattern is a latch unit provided on the input side of the memory and controlled by the control unit.

14. A system for testing a memory according to claim 13, wherein said means for forwarding the data held in said means for temporarily holding comprises a controllable multiplexor connected to the latch unit and to the output port of the memory, the multiplexor being operable to forward data held in the latch unit or data from the memory as requested output data.

15. A system for testing a memory according to claim 14, wherein at least a further memory is to be tested, and the memory and the further memory share the same latch unit.

16. A system for testing a memory according to claim 12, wherein the control unit is operable to select a further complementary test pattern for use in testing the memory.

17. A system for testing a memory according to claim 12, wherein the control unit is operable to successively select all memory locations of the memory, one memory location at a time.

18. A system for testing a memory according to claim 12, wherein the memory is a speech store in operation in a communication switch.

19. A system for testing a memory according to claim 12, wherein at least a further memory is to be tested, and the memory and the further memory share the same control unit.

20. A system for testing a memory in operation, the memory having a number of memory locations, the system comprising:
    a control unit for selecting a memory location in the memory as a test location;
    a storage unit responsive to data from the selected memory location for temporarily holding the data;
    means for forwarding the data held in said storage unit as requested output data when data in the selected memory location is requested in the operation;
    means for writing a test pattern into the selected memory location when new data is to be written to the selected memory location or when no data is written to the memory;
    means for replacing the data previously held in said storage unit by new data when new data is to be written to the selected memory location;
    means for reading the content of the selected memory location in the memory when data in the selected memory location once again is requested in the operation; and
    means for comparing the content read from the selected memory location to the written test pattern, and for selectively, in dependence on the result of the comparison, raising an alarm.

21. A system for testing a memory according to claim 20, further comprising means for writing, after the test of the selected memory location has been completed, the data held in said storage unit into the selected memory location of the memory.

22. A system for testing a memory according to claim 20, wherein said storage unit is a latch unit provided on the output side of the memory and controlled by the control unit.

23. A system for testing a memory according to claim 22, wherein said means for forwarding the data held in said latch unit comprises a controllable multiplexor connected to the latch unit and to the output port of the memory, the multiplexor being operable to forward data held in the latch unit or data from the memory as requested output data.

24. A system for testing a memory according to claim 20, wherein the control unit is operable to select a further complementary test pattern for use in testing the memory.

25. A system for testing a memory according to claim 20, wherein the control unit is operable to successively select all memory locations of the memory, one memory location at a time.

26. A system for testing a memory according to claim 20, wherein the memory is a control store in operation in a communication switch.

27. A system for testing a memory according to claim 20, wherein at least a further memory is to be tested, and the memory and the further memory share the same control unit.

28. A method for testing a memory in operation, the memory having a number of memory locations, the method comprising the steps of:
    selecting a memory location in the memory as a test location;
    in coordination with the normal operation of the memory, temporarily storing data addressed for the selected memory location in a storage unit, writing a test pattern into the selected memory location and reading the content of the selected memory location; and
    comparing the content read from the selected memory location to the written test pattern and raising an alarm if there is a mismatch.

29. A method for testing a memory according to claim 28, further comprising the step of forwarding the data stored in said storage unit as requested output data when data in the selected memory location is requested in the operation.

30. A method for testing a memory according to claim 28, wherein the memory is selected from the group of: a speech store and a control store in operation in a communication switch.

31. A method for testing a memory in operation, the memory having a number of memory locations, the method comprising the steps of:
    selecting a memory location in the memory as a test location;
    in coordination with the normal operation of the memory, temporarily storing data from the selected memory location in a storage unit, writing a test pattern into the selected memory location and reading the content of the selected memory location; and
    comparing the content read from the selected memory location to the written test pattern and raising an alarm if there is a mismatch.

32. A method for testing a memory according to claim 31, further comprising the step of forwarding the data stored in said storage unit as requested output data when data in the selected memory location is requested in the operation.

33. A method for testing a memory according to claim 31, wherein the memory is a control store in operation in a communication switch.

* * * * *